(12) United States Patent
Stelter et al.

(10) Patent No.: US 7,182,843 B2
(45) Date of Patent: Feb. 27, 2007

(54) ROTATING SPUTTERING MAGNETRON

(75) Inventors: Richard Stelter, Buford, GA (US);
Aron Welk, Tracy, CA (US);
Christopher Padua, Campbell, CA (US); Chun Li, Plainview, NY (US)

(73) Assignee: Dexter Magnetic Technologies, Inc., Fremont, CA (US)

( * ) Notice: Subject to any disclaimer, the term of this patent is extended or adjusted under 35 U.S.C. 154(b) by 0 days.

(21) Appl. No.: 10/982,616

(22) Filed: Nov. 3, 2004

(65) Prior Publication Data

US 2005/0103619 A1 May 19, 2005

Related U.S. Application Data

(60) Provisional application No. 60/517,753, filed on Nov. 5, 2003.

(51) Int. Cl.
*C23C 14/35* (2006.01)
(52) U.S. Cl. .............................. 204/192.2; 204/192.12; 204/298.19; 204/298.2; 335/296; 335/302; 335/306
(58) Field of Classification Search ................ 335/296, 335/302, 306; 204/192.12, 192.2, 298.19, 204/298.2
See application file for complete search history.

(56) References Cited

U.S. PATENT DOCUMENTS

| | | | | |
|---|---|---|---|---|
| 4,927,513 A | * | 5/1990 | Schultheiss et al. | 204/192.13 |
| 5,399,252 A | * | 3/1995 | Scherer et al. | 204/298.19 |
| 5,746,897 A | | 5/1998 | Heimanson et al. | |
| 5,762,766 A | * | 6/1998 | Kurita et al. | 204/192.2 |
| 5,865,970 A | | 2/1999 | Stelter | |
| 6,228,235 B1 | * | 5/2001 | Tepman et al. | 204/298.2 |
| 6,258,217 B1 | | 7/2001 | Richards et al. | |
| 6,491,801 B1 | * | 12/2002 | Gung | 204/298.2 |

FOREIGN PATENT DOCUMENTS

| | | | |
|---|---|---|---|
| JP | 60-116774 | * | 6/1985 |
| JP | 62-89864 | * | 4/1987 |
| JP | 03-183123 | * | 8/1991 |

OTHER PUBLICATIONS

PCT Search report and PCT Written Opinion dated Mar. 8, 2006 (All art cited therein has already been cited by U.S. examiner in the 1st OA.).

* cited by examiner

*Primary Examiner*—Rodney G. McDonald
(74) *Attorney, Agent, or Firm*—Blakely Sokoloff Taylor & Zafman

(57) ABSTRACT

The magnet arrangement and resulting rotating sputtering magnetron design of an embodiment provides magnetic flux density and distribution to penetrate thick production ferrous targets. Further, the magnetic field shape improves target life by more uniformly removing target material.

24 Claims, 3 Drawing Sheets

ROTATING SPUTTERING MAGNETRON

CLAIM OF PRIORITY

This application is related to, and hereby claims the benefit of, provisional application No. 60/517,753 filed Nov. 5, 2003.

FIELD

Embodiments of the invention relate to sputtering techniques and apparatuses, and more specifically to sputter depositing ferrous materials with a rotating sputtering magnetron.

BACKGROUND

The primary use for sputtering magnetrons is to sputter material from a target to deposit the target material on a deposition substrate. Fundamentally speaking, sputter deposition stems from a direct current glow discharge (i.e., plasma discharge) between an anode and a cathode in a vacuum. A neon sign is a simple example of such a direct current glow discharge. For sputtering, the cathode is a composed of a target material for which an incident ion knocks loose a target material atom. The target material atom then sticks to whatever surface it strikes. Sputtering a uniform layer of target material on a substrate requires a high level of target material atom scattering. However, such heightened scattering mandates a higher rate of target material consumption and requires frequent deposition chamber cleaning.

Though available in a number of geometries, magnetrons all function based on crossed E and B fields. Such an arrangement can be used to trap the plasma and steer the sputter deposition versus the unconstrained scattering introduced above. A magnetron is generally composed of one magnetic pole surrounding another magnetic pole. The arrangement creates an arched magnetic field between the poles in the shape of a tunnel. Electrons gyrate about lines of magnetic force and, when a continuous magnetic tunnel is present to prevent escape, they will drift along the tunnel until they recombine with an ion, or collide with an atom to form more charged particles. The positively charged ions thus created are drawn to the negative potential of the target where they bombard the target (or any negatively charged system component) to release more atoms. The benefit of using a sputtering magnetron (and the tunnel it produces) is a substantial increase in the sputtering rate coupled with reduced target material waste from deposition on surfaces other than the intended substrate surface.

The shape of the electron tunnel is described by the tangential magnetic flux pattern. These fields have been referred to as having "apple", "bean", "heart", etc., shapes in the prior art. When used with ferrous materials, these field shapes are shunted extensively by the permeable target, so only thin targets allow the characteristic field shape of the magnetron to penetrate, contrary to the target required for a commercially practicable, thick deposition.

Rotating sputtering magnetrons are used, among other applications, to coat the data disks for hard disk drives. Current hard drive technology is based on linear recording. The next generation of hard drives will use vertical recording. This requires a thick deposition of highly magnetically permeable materials. Currently available rotating sputtering magnetrons neither have the field strength required to develop the necessary tangential magnetic field intensity at the surface of usably thick ferrous magnetic targets, nor the field shape needed to sweep the target surface uniformly to maximize target life.

The inability to use thick targets further contributes to the amount of maintenance required of a sputter deposition system. Given that the sputter depositions occur under vacuum and that any contamination contributes detrimentally to the quality of the sputtered material, it is extremely important that the deposition chambers of such systems are properly cleaned, qualified, and maintained. Not only does the use of thicker targets enable thicker depositions, but it also increases the lifespan of the target. The increased lifespan in turn increases the possible utilization of the machine (e.g., up-time versus maintenance down-time to replace the target and perform related maintenance tasks).

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
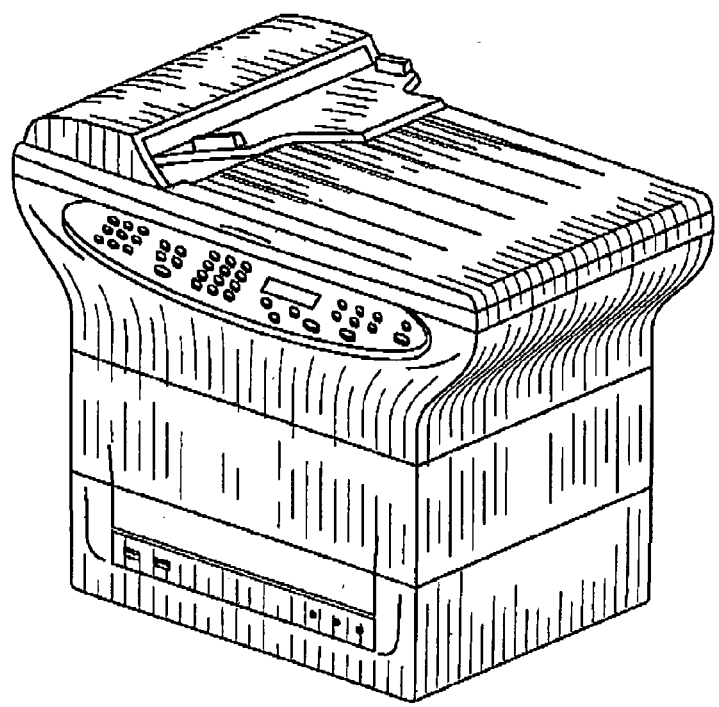
FIG. 1a: illustration of the top view of the tangential magnetic flux pattern created by a magnet arrangement of an embodiment
FIG. 1b: illustration of the side view of the tangential magnetic flux pattern created by a magnet arrangement of an embodiment showing the shape of the electron tunnel

Embodiments of a permanent magnet arrangement and the application thereof to a rotating sputtering magnetron will be described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

As introduced, one of the cost prohibitive factors of sputter depositing a target material with a rotating sputtering magnetron is the useable life of the target. Simply stated, a manufacturer utilizing a rotating sputtering magnetron would be concerned with increasing the useable life of the target while simultaneously minimizing any process parameter variations during that life. The manufacturer would therefore smile upon any process or equipment that would allow the use of thick targets that would be consumed uniformly over an extended lifetime.

In particular, manufacturers of, for example, hard disk drives may require a thick deposition of ferrous material on the disk substrate. As is well known, the deposition of a ferrous material requires a ferrous sputter target. Utilizing ferrous target material adds complexity to the sputter deposition process because the magnetic field created by the magnetron's permanent magnet arrangement is absorbed by the ferrous target. It is therefore important to have a magnet assembly that produces a sufficient magnetic field to overcome the inefficiency created by the ferrous target. Furthermore, the thicker the deposition required, the thicker the ferrous target should be for commercial practicability. The thicker target in turn compounds the requirement for higher magnetic field strength.

The permanent magnet arrangement and resulting rotating sputtering magnetron design of an embodiment provides the magnetic flux density and distribution needed to penetrate thick production ferrous targets. Further, the magnetic field shape improves target life by more uniformly removing target material.

Figure 1A:
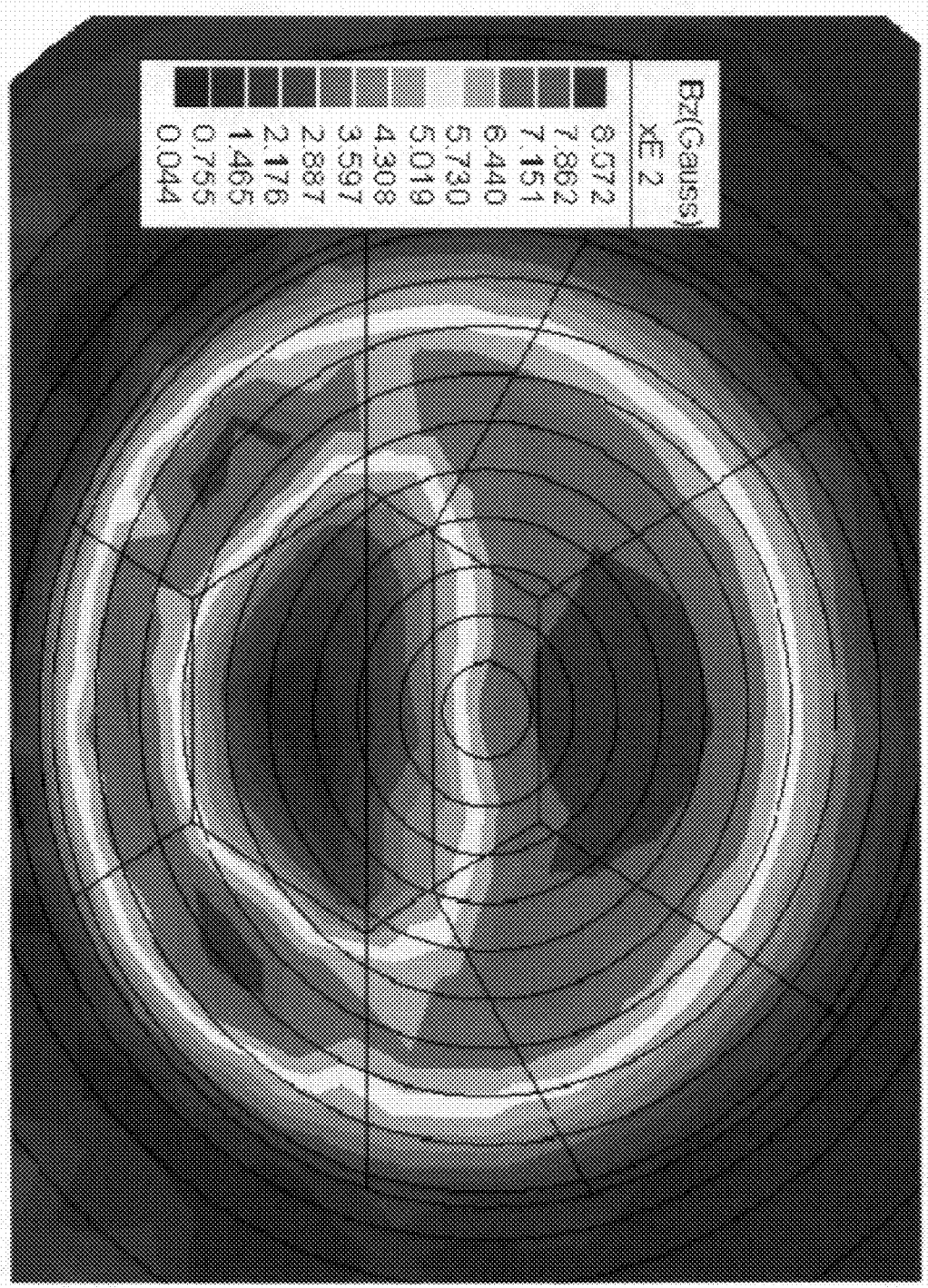
Figure 1B:
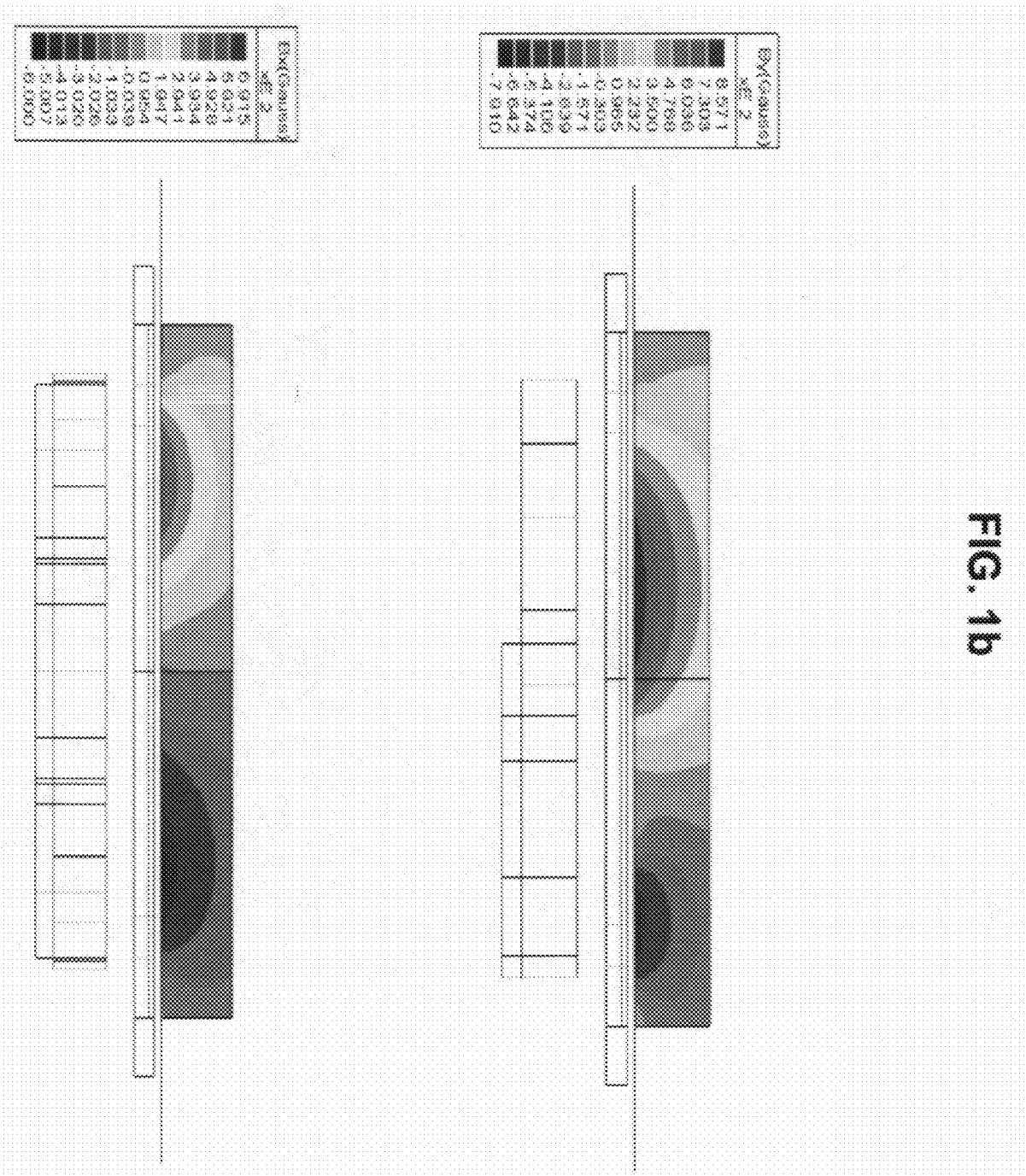
Figure 2:
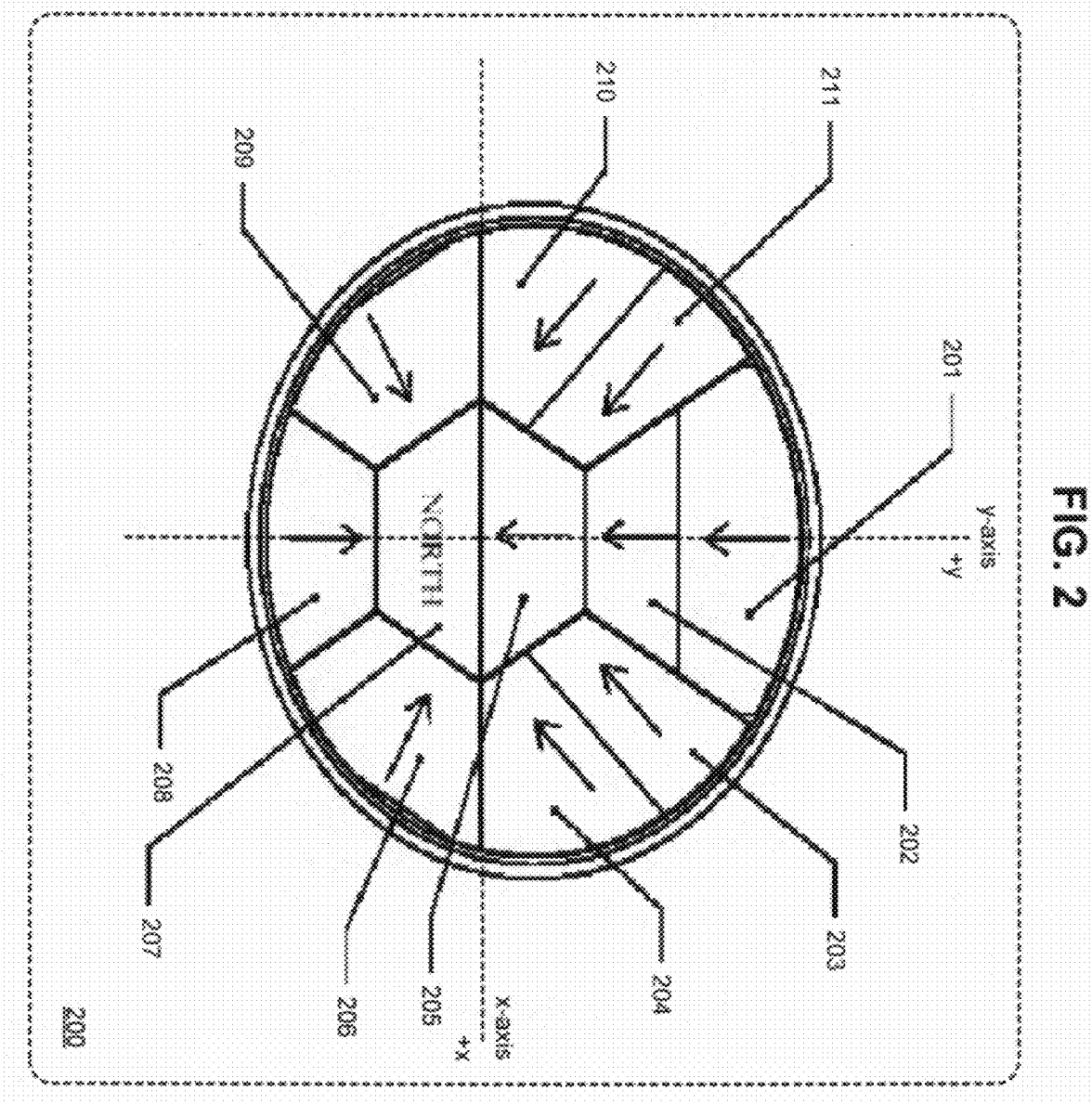
Figure 3:
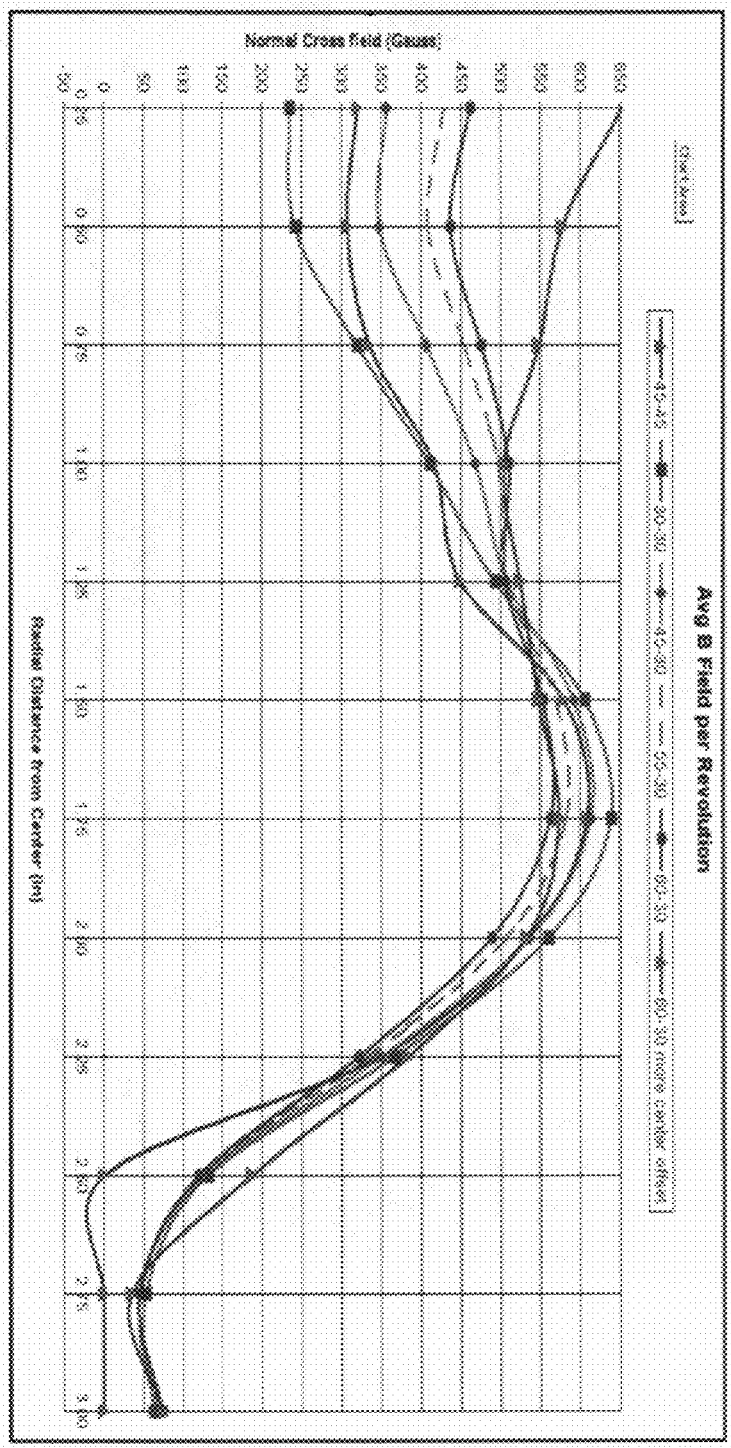
Figure 4:
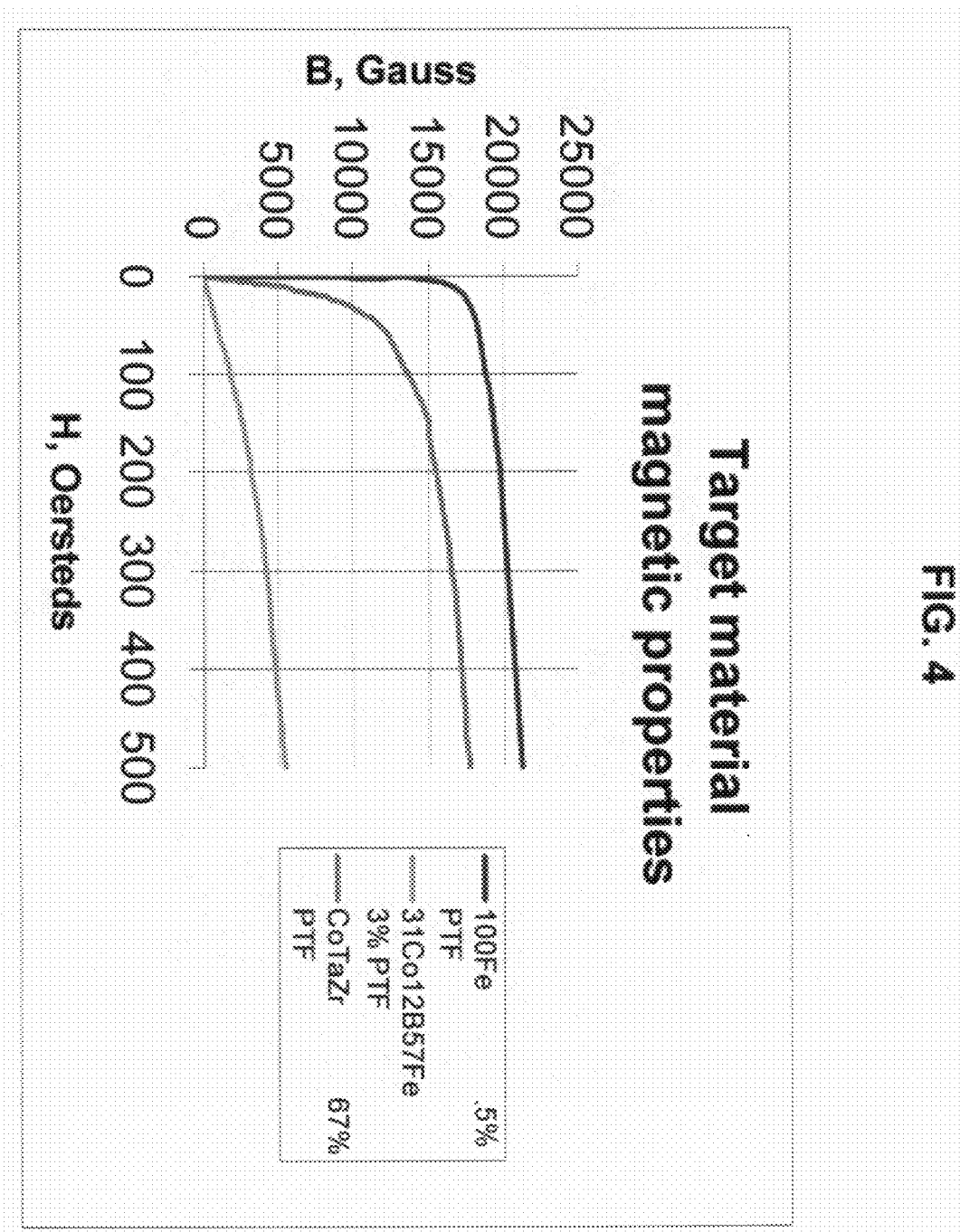
Figure 5:
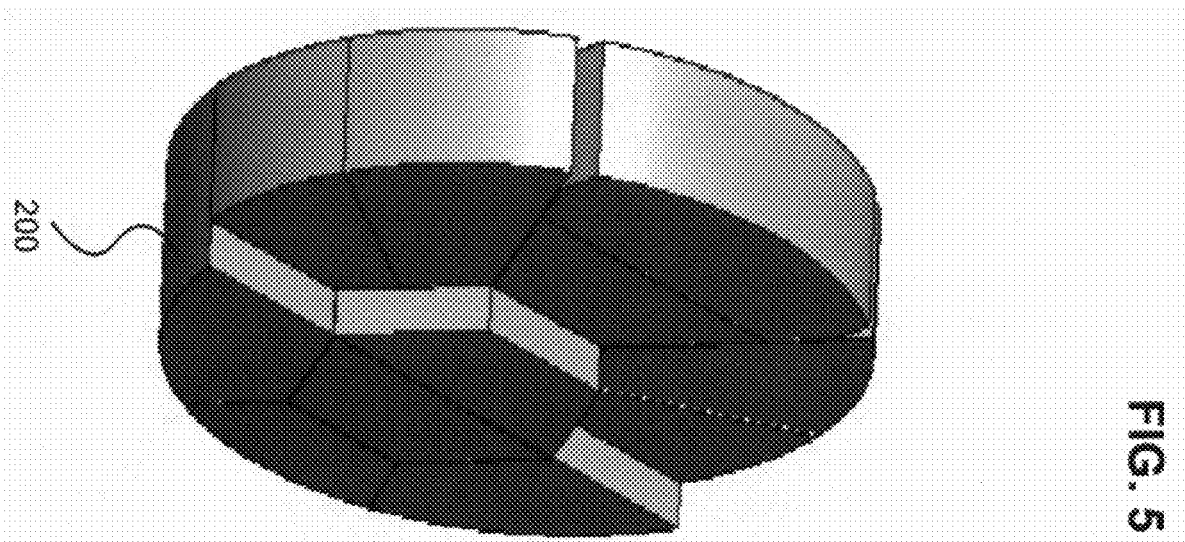
Figure 5:
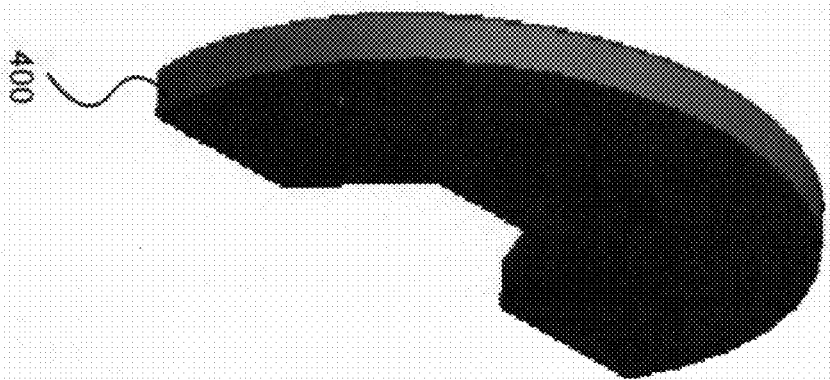
Figure 6:
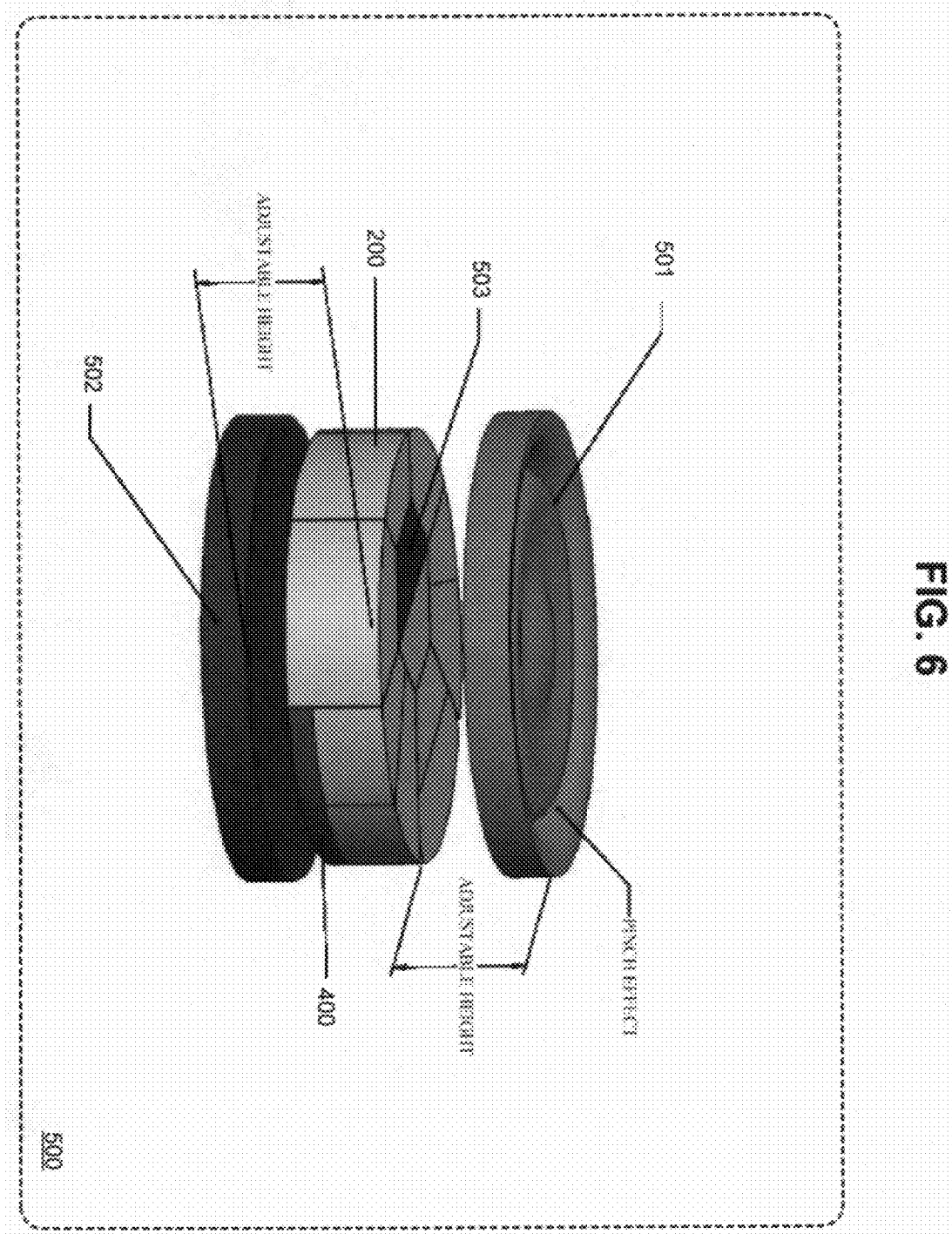

FIG. 1a illustrates the magnetic field shape created by the permanent magnet arrangement 200 (as in FIG. 2) of the rotating sputtering magnetron 500 (as in FIG. 6) of an embodiment. The magnetic field shape resembles that of an obround ring with non-concentric centers, and is offset from the center of the magnet arrangement so the wider portion of the tangential field covers some portion of the target center. When the magnet arrangement 200 rotates, the target experiences a magnetic field of varying width, shape and intensity to improve sputter deposition rate and target life as introduced above. The component of magnetic flux parallel to the target surface is referred to as the tangential component, and its location, intensity and shape are also related to sputtering activity. FIG. 1b illustrates the side view of the tangential magnetic field created by the magnet arrangement and the shape of the electron tunnel created thereby.

Figure 2:
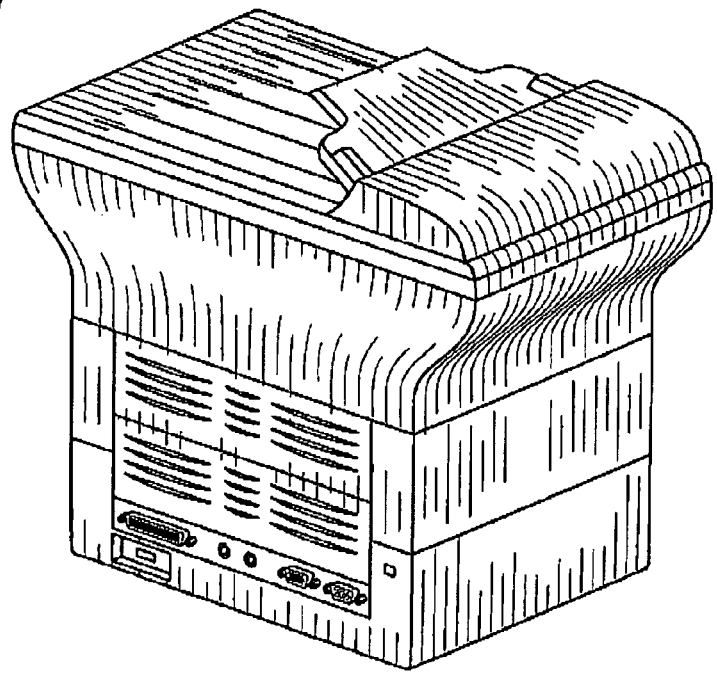
FIG. 2: illustration of the magnet arrangement of an embodiment and the magnetic field orientations of the constituent magnets

FIG. 2 illustrates a top view of a permanent magnet arrangement 200 for the rotating sputtering magnetron 500 of an embodiment. The illustrated geometry is built around a hexagonal shape, but it will be understood by those skilled in the art that other polygons and curved parts can be similarly implemented. A theoretically ideal magnetron would produce a continuous rotation of the magnetic vectors. However, the magnet arrangement 200 and resulting magnetron 500 of an embodiment produce effective, practical, and producible sputtering devices.

FIG. 2 specifically illustrates the constituent magnets 201–211 of the magnet arrangement 200 of an embodiment. Magnets 201 through 212 in an embodiment are individually approximately shaped like a trapezoid to accommodate the overall hexagonal shape of the magnet arrangement 200. Though shown as individual magnets, it is to be understood that, for example, magnets 201 and 202, among others, can be a single magnet or multiple magnets provided the individual magnets comprising the trapezoid maintain substantially the same magnetic pole orientation. In an embodiment, magnets 201 and 202, 203 and 204, and 205 and 206 operate as pairs to form the substantially trapezoidal elements of the approximately hexagonal overall magnet arrangement 200. In an embodiment, magnets 205–209 are single substantially trapezoidal magnets.

It is to be understood that the magnets or magnet groups, though described as geometric shapes, may not conform to the precise definition of the shape. The geometrical term is meant to give an overall sense of the shape versus constraining necessarily the substantially trapezoidal shape disclosed above to, for example, exactly four sides. Various practical manufacturing concerns may include, for example, machining or otherwise subdividing a bulk magnet ingot into a number of individual magnets that, to most efficiently utilize the bulk magnet ingot, have an additional facet or facets as required by the subdivision.

Magnets 205 and 207 occupy the interior area defined by magnets 201–204, 206, and 208–211. In an embodiment, magnet 205 has the same magnetic pole orientation as magnets 201 and 202. Magnet 207 has a magnetic pole orientation that is substantially normal to the plane defined by the magnetic pole orientations of magnets 201–206 and 208–211.

The tangential magnetic flux pattern and magnetic field of the magnet arrangement 200 of an embodiment depends on the magnetic pole orientations of the individual magnets 201–211 comprising the magnet arrangement 200. As depicted by FIG. 2, the magnetic pole orientations of the constituent magnets 201–211 can be described with reference to the Cartesian axes superimposed on the magnet arrangement and used for illustrative purposes only. For example, the magnetic pole orientation of magnets 201, 202, and 205 are substantially congruent with the y-axis and in the −y direction. The magnetic pole orientation of magnet 208 is substantially congruent with the y-axis and in the +y direction. Magnets 203 and 204 have substantially the same magnetic pole orientation angle (as they form an aforementioned trapezoid pair) and the angle is substantially a reflection over the y-axis of the magnet 210 and 211 magnetic pole orientation angles. Further, the magnet 206 magnetic pole orientation angle is approximately a reflection over the y-axis of the magnet 209 magnetic pole orientation angle. The magnetic pole orientation of magnet 207 is parallel to a z-axis that would extend out of the page in the +z direction, and itself in the +z direction.

The overall magnet arrangement 200 scheme is such that the individual magnets (except for axially oriented magnet 207) have magnetic pole orientations radially oriented and directed roughly toward the off-center origin of the illustrative Cartesian axes as drawn. The amount of offset is variable depending on the specific magnetron 500 application. In an embodiment, the off-center origin is approximately ⅓ of the diameter distance from a radial edge of the magnet arrangement 200. Said differently, in an embodiment including an 8 inch diameter magnet arrangement 200, the off-center origin is approximately 1⅓ inch off-center. The offset distance may be determined by finite element or boundary element analysis of a particular magnet arrangement 200 system. As further illustrated by FIG. 2, the superimposed y-axis bisects the magnet arrangement 200. However, the superimposed x-axis does not also bisect the magnet arrangement 200. As noted above, the rotational center of the magnet arrangement 200 (i.e., the center of the magnet arrangement 200 circle) is not the magnetic field orientation axis (i.e., the axis to which all the radially oriented magnets 201–206 and 208–211 approximately point and as represented approximately by the Cartesian axes origin). The magnetic pole orientation angles of the individual magnets with the aforementioned symmetry can nevertheless by changed, thereby altering the tangential magnetic flux pattern illustrated by FIG. 1.

Figure 3:
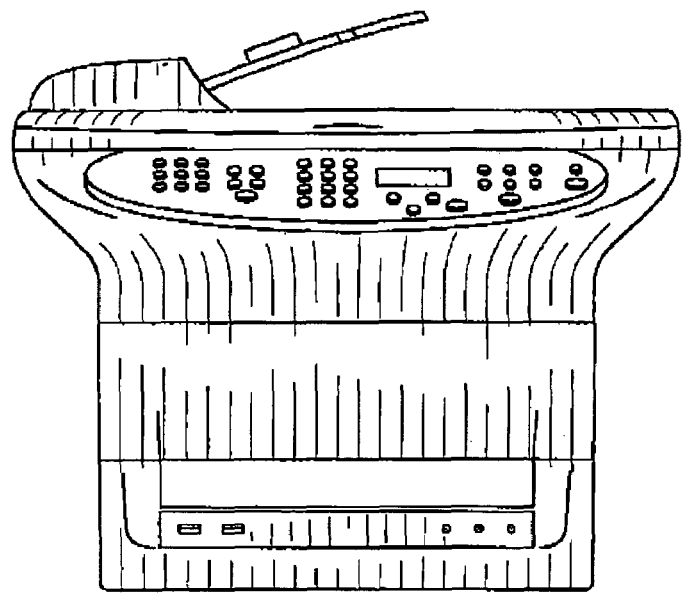
FIG. 3: illustration of the magnetic flux density of the magnet arrangement of an embodiment for one rotation versus the radial location on the target

FIG. 3 illustrates the average tangential magnetic flux by the magnet arrangement 200 through one 360° rotation as a function of radial distance from the rotational axis of the magnet arrangement 200 for a variety of individual magnet orientations. For each graph series, the angle of magnets 203, 204 (therefore also 210 and 211 by symmetry) and 206 (therefore also magnet 209 by symmetry) are identified in the legend. For example, the first series "45—45" indicates that the absolute value of the angle between the y-axis and magnets 206 and 209 is 45 degrees (the first "45" of the legend) and that the absolute value of the angle between magnets 203, 204, 210, and 211 and the y-axis is 45 degrees (the second "45" of the legend). The second series indicates that the absolute value of the angle between magnets 203, 204, 206, and 209–211 and the y-axis is 30 degrees. The third series indicates that the absolute value of the angle between magnets 206 and 209 and the x-axis is 45 degrees while the absolute value of the angle between magnets 203, 204, 210, and 211 and the y-axis is 30 degrees. Series 4 and Series 5 indicate angle absolute values of 55 degrees/30 degrees and 60 degrees/30 degrees respectively as described above. Series 6 indicates 60 degrees and 30 degrees respectively as described above, and an increased offset, in an embodiment approximately 0.2 inches, between the magnetic axis and the rotational axis of the magnet arrangement 200. While embodiments have been described with reference to particular combination of angles, it is to be understood that other angle combinations may be used depending on, among other elements, magnet shape, target material, and desired magnetic flux pattern.

The graph of FIG. 3 demonstrates that the intensity of the magnetic field component parallel to the target surface versus radius can be varied by altering the angles of magnets 203, 204, 206, and 209–211. The angles can be adjusted, among other reasons, to increase the likelihood of extracting atoms from the central region of the target. Increased ion bombardment in the central area of the target reduces the potential for target material redeposition in this area. As redeposited target material must be removed periodically as it may have unpredictable physical and chemical characteristics, it is important that redeposition in the central area of the target be properly mitigated as accomplished by utilizing a magnet arrangement 200 of an embodiment.

The tangential component of the magnetic field is important, but the magnetic field vector has other components. Electrons gyrate around magnetic vectors and migrate through the electron tunnel, so the vector component normal to the target surface describes a boundary for the electron tunnel. The electron tunnel is a description of the shape of the effective magnetic field in the sputtering process. As noted, electrons gyrate about lines of magnetic flux in proportion to the intensity of the magnetic field. The electron gyration is more intense in the center of the electron tunnel where, being closer to the source of the magnetic field, the magnetic field intensity is greater. For sputtering, the effect is to create more atomic collisions (thereby ions and secondary electrons) in a particular region to propagate the sputtering deposition process. The shape, orientation and strength of the described magnetron components produce the boundaries of the field shape described here and are adjusted to achieve the desired results with each target material.

The magnet materials comprising the magnet arrangement 200 can be any magnetic material that will produce the required magnetic field. Distance from the magnet arrangement 200 face to the face of the target, the target material properties (permeability and saturation induction) and the demagnetizing effect of adjacent magnets with orientations in quadrature are further considerations for magnet material choice. In an embodiment, high energy, high coercivity samarium cobalt (28 MGOe SmCo) and neodymium iron boron (48 MGOe NdFeB) materials are employed by magnet arrangement 200 to sputter ferrous target materials in magnetron 500, but it is to be understood that other permanent magnet materials may be used if larger magnets are compatible with the sputter device.

The magnets comprising the magnet arrangement 200 of an embodiment may attach to a base plate (in an embodiment, an approximately circular base plate) with nonmagnetic fixtures, LOCTITE 330 adhesive, and a potting compound. The nonmagnetic fixtures may include brass clamps, aluminum blanks machined to substantially the shape of the magnets, and Delrin push blocks to force magnets into a housing unit. In an embodiment, a steel (i.e., ferromagnetic) block is provided directly beneath the housing to assist maintaining the magnets' position during the assembly process as the magnets are attracted to the steel plate. In an embodiment, the magnets comprising the magnet arrangement 200 are bonded together to form the magnet arrangement 200 without a base plate.

Figure 4:
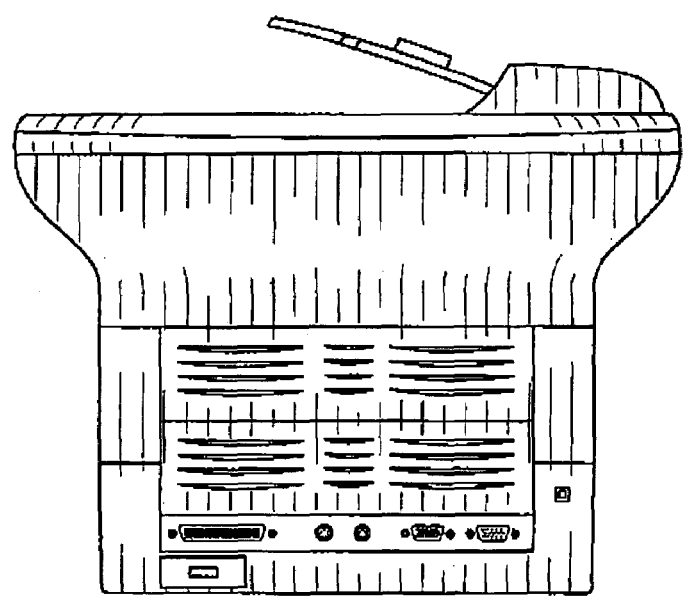
FIG. 4: illustration of the magnetic properties for ferrous target materials

While the field shaping and field intensity related features of the rotating sputtering magnetron 500 including magnet arrangement 200 described herein are effective with either ferrous or non-ferrous sputtering targets, achieving results with ferrous targets is more difficult as introduced above. The magnetic properties of a ferrous sputtering target material homogenize variations in the direction of the effective magnetic moments (i.e., magnetic pole orientation) of the permanent magnets in the magnet arrangement 200 to varying extents. The effect varies with the magnetic permeability and saturation characteristics of the target material composition used, and to some extent by the process used to make the targets. This effect is defined in the sputtering industry by a single point measurement known as percent of pass through flux ("PTF") as defined in ASTM F1761-00, Standard Test Method for Pass Through Flux of Circular Magnetic Sputtering Targets. The single point PTF values are useful to differentiate ferrous target categories. Full target material B-H curve information is further useful for magnetron 500 design as each finite volume of a particular target material operates at a different point on the target material's B-H curve, and this changes as the magnet arrangement 200 rotates. The B-H operating point for each finite target volume is dependent on its position relative to the magnetizing field created by the magnet arrangement 200 and its thickness (among other dimensions). FIG. 4 illustrates B-H curves for three ferrous alloys common to ferrous targets.

Figure 5:
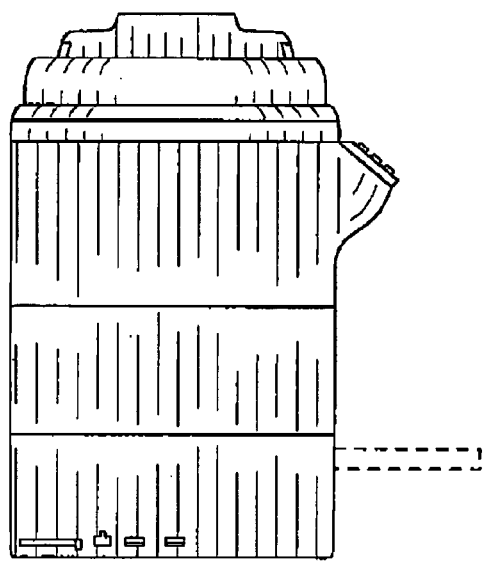
FIG. 5: illustration of an isometric view of the magnet arrangement of an embodiment including a counter balance plate

FIG. 5 illustrates an isometric view of the magnet arrangement 200 including a raised portion of the magnet arrangement 200. Fabricating the shorter magnetic length magnets 205–209 with a greater thickness than magnets 201–204 and 210–211 increases the magnets' 205–209 volume to adjust the magnets' 205–209 operating point on their B-H curves to compensate for their shorter magnetic length. The increased thickness of the shorter magnetic length magnets 205–209 in turn balances the tangential magnetic field strength over the surface of the magnet arrangement 200. This reduces voltage fluctuations in the sputtering system incorporating the magnet arrangement 200 of an embodiment. Also shown in this view is a non-magnetic counter balance plate 400. The non-magnetic counter balance plate 400 allows the magnet arrangement 200 to have a balanced rotation around its rotational axis. Further, as the non-magnetic balance plate 400 is indeed non-magnetic, it does not contribute to the magnetic field generated by the magnet assembly 200.

The magnet arrangement 200 described to this point is directional by virtue of an axially oriented magnet 207 surrounded by magnets with radial orientations as illustrated by FIG. 2. This produces a more intense magnetic field on the target side. It should be noted that in an embodiment, the axially oriented magnet 207 could be omitted or replaced by a steel section. Omitting axially oriented magnet 207 reduces the polar flux density and alters magnetic flux distribution of the magnet arrangement 200. The omission may be appropriate when numerical analysis of the full magnetic system (including the magnetron, target, as well as facing magnetron and target in two-sided sputtering systems) suggests that the omission is appropriate. In a further embodiment, including a steel section in place of axially oriented magnet 207 may be an appropriate method to adjust magnetic flux density and distribution for a particular application. Individual radially oriented magnet (e.g., magnets 201–206, and 208–211) dimensions can then be adjusted to achieve a desired magnetic flux density pattern at the target.

More particularly, including a steel polar section, since its polarity is determined by magnetic circuit reluctance values (in turn determined by magnetic circuit materials and dimensions), further permits introducing a fixed shunting disk on the magnet arrangement 200 side distal from a ferrous target. Omitting the axially oriented magnet 207 also permits such shunting. The shunt disk then acts like an arm of an electrical bridge circuit, and as the shunt disk nears the magnetron side distal from a ferrous target, it bleeds away a portion of the available magnetic flux. Accordingly, a shunt disk allows the magnetic field intensity generated by the magnet arrangement 200 and experienced by the target to be adjusted either manually or automatically as, for example, the sputter deposition consumes the target material. This adjustment may aid in the reduction of target pinching. Target pinching occurs when continued target erosion along a fixed path results in a groove where electrons, now closer to the magnet arrangement 200, find higher intensity magnetic field lines and as a result become more active. The more active electrons in turn accelerate the erosion along the fixed path. Unchecked, target pinching will end the useable life of the target as the groove effectively burns through the target. Target pinch is further accelerated in the case of ferrous target materials because the sides of the eroded groove form polar areas to concentrate and focus available magnetic flux. This exacerbates the erosion by further increasing the intensity of the lines of magnetic flux in the tunnel.

Figure 6:
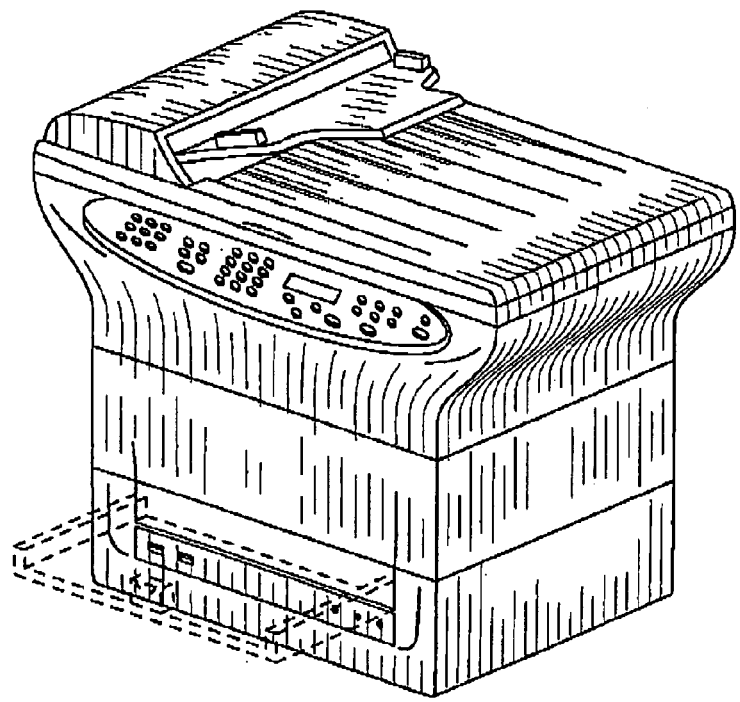
FIG. 6: illustration of the magnet arrangement of an embodiment in a rotating sputtering magnetron in combination with a target and a shunt disk

FIG. 6 is an illustration of the magnet arrangement 200 of an embodiment as part of a rotating sputtering magnetron 500. The magnet arrangement 200 is positioned between a target 501 and a shunt disk 502. In an embodiment, the axially oriented magnet 207 has been replaced with a steel section 503 as noted above. The distance between the magnet arrangement 200 and the shunt disk 502 may be altered either by moving the shunt disk 502, moving the magnet arrangement 200, or both. Similarly, the distance between the target 501 and the magnet arrangement 200 may be altered, either by moving the target 501 or by moving the magnet arrangement 200. The movement of the magnet arrangement 200, target 501, or shunt disk 502, or any subset or combination thereof, can occur manually or automatically.

Adjusting the distances between the target 501, magnet arrangement 200, and shunt disk 502 in the rotating sputtering magnetron 500 allows the sputter deposition to be controlled as, for example, the target 501 is consumed during the deposition. As noted, the permeable shunt disk 502 function compares to a variable resistor in one arm of an electrical balance bridge. The electrical bridge variable resistor can be physically adjusted to control current flowing in the other arm of the bridge. Similarly, the distance of the shunt disk 502 from the side of magnet arrangement 200 distal to the target 501 adjusts the magnetic flux available to the target 501 and particularly to the eroded area of the target 501.

As further illustration, a symmetric radially oriented magnet arrangement with a steel center pole and a shunt disk equidistant from both planar surfaces would share its available magnetic flux equally with both shunt disks as long as the distance between the magnet arrangement and each shunt disk were equal. As one disk moves closer to the magnet arrangement, it will absorb more of the available magnetic flux reducing flux density in the other shunt disk. The size, position, composition, and resulting effectiveness of the shunt disk depends on the permeance of all magnetic circuit components and may be determined by iterative numeric analysis. The controllability of the sputter deposition based on altering distances between and among the magnet arrangement 200, the target 501, and the shunt disk 502, in addition to the magnetic flux pattern created by the magnet arrangement 200 of an embodiment, enables better utilization of ferrous sputter targets and longer run times. Further, the shunt disk 502 mitigates target 501 pinching as described above. In particular, the target 501 pinching can be mitigated by retracting the magnet arrangement 200 incrementally from the target 501 (or by otherwise increasing the separation between the magnet arrangement 200 and the target 501) as erosion advances, by using a shunting disk 502 on the magnet arrangement 200 side distal from the sputtering target 501 to allow a natural redistribution of magnetic flux, or by a combination of both mitigation methods.

In an embodiment the rotating sputtering magnetron 500 described herein can be used with a fixed permeable shunt disk 502 on the side of the magnet arrangement 200 distant from the target 501 to form a magnetic flux divider circuit. This permeable shunt disk 502, of appropriate material, size and shape (in an embodiment low carbon steel or other permeable materials such as nickel-iron or iron cobalt alloys with a diameter approximately equal to that of the magnet arrangement 200), functions as one branch of a flux divider circuit while the target 501 is the other branch of the flux divider circuit. Initially, magnetic flux is distributed proportionately to both the target 501 and the shunt disk 502. As erosion takes place under the plasma on the target 501 face, the magnetic reluctance in the target 501 branch of the flux bridge increases and more flux is transferred to the shunt disk 502. This reduces the rate at which the erosion groove deepens in the target 501.

The magnet arrangement 200 can also be retracted toward the shunt disk 502. With such a method, less magnet arrangement 200 retraction from the target 501 is required because the magnet arrangement 200 simultaneously approaches the shunt disk 502. A variety of shunt disk 502 materials with different magnetic permeability and saturation values may be used to adjust the magnetic flux transfer ratio for various target 501 materials. The shunt disk 502 may also be displaced axially to obtain similar flux divider ratios.

The magnetron 500 including the magnet arrangement 200 of an embodiment may utilize a second magnet arrangement 200 (i.e., as a facing pair of magnet arrangements 200) to coat both sides of a substrate simultaneously. The magnet arrangements 200 usually rotate independent of each other, and may rotate in opposite directions. Because the individual magnet arrangement 200 magnetic fields are intense, the magnetic field shape of one magnet arrangement 200 affects that of the other. Synchronizing the rotation of opposing magnet arrangements 200 to position the magnetic fields in a fixed or variable relation to each other allows further modification of the effective tangential magnetic field shape.

The features of the rotating sputtering magnetron 500 described herein also creates a magnetic orientation in the deposited ferrous film. In an embodiment employing dual magnet arrangements 200 and targets 501 to coat both sides of a disk simultaneously, the magnetic field interaction between the opposing magnet arrangements 200 can be controlled to produce variations in the magnetic orientation in the deposited film. In an embodiment, the opposing magnet arrangements 200 spin substantially synchronously and 180° out of phase to produce a substantially radial magnetic orientation in the deposited film. Other relative magnet arrangement 200 rotational combinations may produce a substantially circumferential magnetic orientation in the deposited film. It is to be understood that by altering the magnet arrangement 200 rotational combination may produce magnetic orientations in the deposited film between circumferential and radial.

One skilled in the art will recognize the elegance of the disclosed embodiment in that it improves the ability to use thick sputtering targets to allow both uniformly deposited, thick, ferrous sputter depositions on the surface of the data disk and extended sputtering target life.

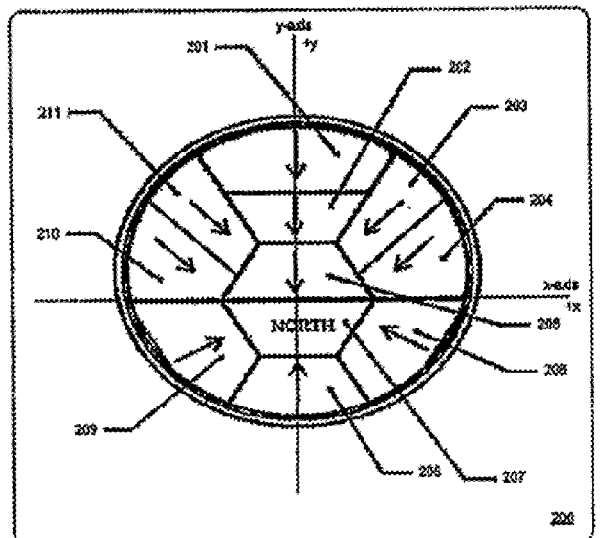

What is claimed is:

1. A magnet arrangement comprising
  a circular base plate having a rotational axis that is substantially normal to the circular base plate and substantially centered on the circular base plate, the rotational axis being substantially parallel to and offset from a magnetic field axis of the magnet arrangement;
  a first magnet coupled to the circular base plate so as to be offset from the magnetic field axis toward the rotational axis, the first magnet having a magnetic field orientation that is substantially radial to the magnetic field axis;
  a second magnet positioned about the magnetic field axis, the second magnet having a magnetic field orientation that is parallel to the magnetic field axis; and
  a plurality of outer magnets coupled to the circular base plate and surrounding both the first magnet and the second magnet, each of the outer magnets having a magnetic field orientation that is substantially radial to the magnetic field axis.

2. The magnet arrangement of claim 1 wherein each of one or more of the magnets comprises a plurality of component magnets, having substantially the same magnetic field orientation.

3. The magnet arrangement of claim 1 wherein one of the magnets has a different thickness than another of the magnets, the thickness measured in a direction normal to the circular base plate.

4. The magnet arrangement of claim 1 further comprising a non-magnetic counter balance plate coupled to the circular base plate to rotationally balance the magnet arrangement about the rotational axis.

5. A magnet arrangement comprising:
  a circular base plate having a rotational axis that is substantially normal to the circular base plate and substantially centered on the circular base plate, the rotational axis being substantially parallel to and offset from a magnetic field axis of the magnet arrangement;
  a first magnet coupled to the circular base plate so as to be offset from the magnetic field axis toward the rotational axis, the first magnet having a magnetic field orientation that is substantially radial to the magnetic field axis; and
  a plurality of outer magnets coupled to the circular base plate and surrounding the first magnet so as to form a cavity bounded by the first magnet and a selection of the outer magnets, each of the outer magnets having a magnetic field orientation that is substantially radial to the magnetic field axis, the cavity positioned about the magnetic field axis.

6. The magnet arrangement of claim 5 further comprising a metal section in the cavity.

7. The magnet arrangement of claim 6 wherein the metal section comprises steel.

8. The magnet arrangement of claim 5 wherein each of one or more of the magnets comprises a plurality of component magnets having substantially the same magnetic field orientation.

9. The magnet arrangement of claim 5 wherein one of the magnets has a different thickness than another of the magnets, the thickness measured in a direction normal to the circular base plate.

10. The magnet arrangement of claim 5 further comprising a non-magnetic counter balance plate coupled to the circular base plate to rotationally balance the magnet arrangement about the rotational axis.

11. A method comprising:
  sputtering, with a magnetron, a ferrous material onto a substrate wherein the magnetron includes a magnet arrangement, the magnet arrangement including
  a circular base plate having a rotational axis that is substantially normal to the circular base plate and substantially centered on the circular base plate, the rotational axis being substantially parallel to and offset from a magnetic field axis of the magnet arrangement;
  a first magnet coupled to the circular base plate so as to be offset from the magnetic field axis toward the rotational axis, the first magnet having a magnetic field orientation that is substantially radial to the magnetic field axis; and
  a plurality of outer magnets coupled to the circular base plate and surrounding the first magnet so as to form a cavity bounded by the first magnet and a selection of the outer magnets, each of the outer magnets having a magnetic field orientation that is radial to the magnetic field axis, the cavity positioned about the magnetic field axis.

12. The method of claim 11 further comprising: shunting, with a shunt disk, a magnetic field generated by the magnetron.

13. The method of claim 12 further comprising:
  adjusting, during the sputtering, the distance between the magnet arrangement and the shunt disk.

14. The method of claim 11 further comprising:
  adjusting, during the sputtering, the distance between the magnet arrangement and the ferrous target.

15. The method of claim 13 further comprising:
  adjusting, during the sputtering, the distance between the magnet arrangement and the ferrous target.

16. A method comprising:
  sputtering, with a magnetron, a ferrous material onto a substrate wherein the magnetron includes a magnet arrangement, the magnet arrangement including
  a circular base plate having a rotational axis that is substantially normal to the circular base plate and substantially centered on the circular base plate, the rotational axis being substantially parallel to and offset from a magnetic field axis of the magnet arrangement,
  a first magnet coupled to the circular base plate so as to be offset from the magnetic field axis toward the rotational axis, the first magnet having a magnetic field orientation that is substantially radial to the magnetic field axis, a second magnet positioned about the magnetic field axis, the second magnet having a magnetic field orientation that is parallel to the magnetic field axis, and a plurality of outer magnets coupled to the circular base plate and surrounding both the first magnet and the second magnet, each of the outer magnets having a magnetic field orientation that is substantially radial to the magnetic field axis.

17. The method of claim 16 further comprising:
shunting, with a shunt disk, a magnetic field generated by the magnetron.

18. The method of claim 17 further comprising:
adjusting, during the sputtering, the distance between the magnet arrangement and the shunt disk.

19. The method of claim 16 further comprising:
adjusting, during the sputtering, the distance between the magnet arrangement and the ferrous target.

20. The method of claim 18 further comprising:
adjusting, during the sputtering, the distance between the magnet arrangement and the ferrous target.

21. A method comprising:
sputtering, with a first rotating magnetron, a ferrous material onto a first side of a substrate;
sputtering, with a second rotating magnetron, the ferrous material onto a second side of the substrate, the first rotating magnetron and the second rotating magnetron each comprising a magnet arrangement, the magnet arrangement including
a circular base plate having a rotational axis that is substantially normal to the circular base plate and substantially centered on the circular base plate, the rotational axis being substantially parallel to and offset from a magnetic field axis of the magnet arrangement,
a first magnet coupled to the circular base plate so as to be offset from the magnetic field axis toward the rotational axis, the first magnet having a magnetic field orientation that is substantially radial to the magnetic field axis, and
a plurality of outer magnets coupled to the circular base plate and surrounding the first magnet so as to form a cavity bounded by the first magnet and a selection of the outer magnets, the plurality of outer magnets each having a magnetic field orientation that is substantially radial to the magnetic field axis, the cavity positioned about the magnetic field axis; and altering the relative rotations of the first rotating magnetron and the second rotating magnetron to alter a magnetic orientation in the sputtered ferrous material.

22. The method of claim 21 further comprising:
rotating the first rotating magnetron and the second rotating magnetron substantially synchronously and substantially 180 degrees out of phases to produce a substantially radial magnetic orientation in the sputtered ferrous material.

23. A method comprising:
sputtering, with a first rotating magnetron, a ferrous material onto a first side of a substrate;
sputtering, with a second rotating magnetron, the ferrous material onto a second side of the substrate, the first rotating magnetron and the second rotating magnetron each comprising a magnet arrangement, the magnet arrangement including
a circular base plate having a rotational axis that is substantially normal to the circular base plate and substantially centered on the circular base plate, the rotational axis being substantially parallel to and offset from a magnetic field axis of the magnet arrangement,
a first magnet coupled to the circular base plate so as to be offset from the magnetic field axis toward the rotational axis, the first magnet having a magnetic field orientation that is substantially radial to the magnetic field axis,
a second magnet positioned about the magnetic field axis, the second magnet having a magnetic field orientation that is parallel to the magnetic field axis, and
a plurality of outer magnets coupled to the circular base plate and surrounding both the first magnet and the second magnet, each of the outer magnets having a magnetic field orientation that is substantially radial to the magnetic field axis; and
altering the relative rotations of the first rotating magnetron and the second rotating magnetron to alter a magnetic orientation in the sputtered ferrous material.

24. The method of claim 23 further comprising:
rotating the first rotating magnetron and the second rotating magnetron substantially synchronously and substantially 180 degrees out of phases to produce a substantially radial magnetic orientation in the sputtered ferrous material.

* * * * *

UNITED STATES PATENT AND TRADEMARK OFFICE
CERTIFICATE OF CORRECTION

| | | |
|---|---|---|
| PATENT NO. | : 7,182,843 B2 | |
| APPLICATION NO. | : 10/982616 | |
| DATED | : February 27, 2007 | |
| INVENTOR(S) | : Richard Stelter | |

It is certified that error appears in the above-identified patent and that said Letters Patent is hereby corrected as shown below:

Delete the title page and substitute therefor the attached title page showing the correct illustrative figure and statement regarding color drawings.

Delete Drawing Sheets 1, 2 and 3, and substitute therefor the attached Drawing Sheets 1-7, consisting of Figs. 1a, 1b, 2, 3, 4, 5 and 6.

Signed and Sealed this

Tenth Day of July, 2007

JON W. DUDAS
*Director of the United States Patent and Trademark Office*

(12) United States Patent
Stelter et al.

(10) Patent No.: US 7,182,843 B2
(45) Date of Patent: Feb. 27, 2007

(54) ROTATING SPUTTERING MAGNETRON

(75) Inventors: Richard Stelter, Buford, GA (US); Aron Welk, Tracy, CA (US); Christopher Padua, Campbell, CA (US); Chun Li, Plainview, NY (US)

(73) Assignee: Dexter Magnetic Technologies, Inc., Fremont, CA (US)

(*) Notice: Subject to any disclaimer, the term of this patent is extended or adjusted under 35 U.S.C. 154(b) by 0 days.

(21) Appl. No.: 10/982,616

(22) Filed: Nov. 3, 2004

(65) Prior Publication Data
US 2005/0103619 A1 May 19, 2005

Related U.S. Application Data

(60) Provisional application No. 60/517,753, filed on Nov. 5, 2003.

(51) Int. Cl.
*C23C 14/35* (2006.01)

(52) U.S. Cl. ............... 204/192.2; 204/192.12; 204/298.19; 204/298.2; 335/296; 335/302; 335/306

(58) Field of Classification Search ............... 335/296, 335/302, 306; 204/192.12, 192.2, 298.19, 204/298.2
See application file for complete search history.

(56) References Cited

U.S. PATENT DOCUMENTS

| | | | |
|---|---|---|---|
| 4,927,513 A * | 5/1990 | Schultheiss et al. ... | 204/192.13 |
| 5,399,252 A * | 3/1995 | Scherer et al. ........ | 204/298.19 |
| 5,746,897 A | 5/1998 | Heimanson et al. | |
| 5,762,766 A * | 6/1998 | Kurita et al. .......... | 204/192.2 |
| 5,865,970 A | 2/1999 | Stelter | |
| 6,228,235 B1 * | 5/2001 | Tepman et al. ......... | 204/298.2 |
| 6,258,217 B1 | 7/2001 | Richards et al. | |
| 6,491,801 B1 * | 12/2002 | Gung ..................... | 204/298.2 |

FOREIGN PATENT DOCUMENTS

| | | | |
|---|---|---|---|
| JP | 60-116774 | * | 6/1985 |
| JP | 62-89864 | * | 4/1987 |
| JP | 03-183123 | * | 8/1991 |

OTHER PUBLICATIONS

PCT Search report and PCT Written Opinion dated Mar. 8, 2006 (All art cited therein has already been cited by U.S. examiner in the 1st OA).

* cited by examiner

*Primary Examiner*—Rodney G. McDonald
(74) *Attorney, Agent, or Firm*—Blakely Sokoloff Taylor & Zafman

(57) ABSTRACT

The magnet arrangement and resulting rotating sputtering magnetron design of an embodiment provides magnetic flux density and distribution to penetrate thick production ferrous targets. Further, the magnetic field shape improves target life by more uniformly removing target material.

24 Claims, 7 Drawing Sheets
(6 of 7 Drawing Sheet(s) Filed in Color)